United States Patent
Lin et al.

(10) Patent No.: US 8,334,216 B2
(45) Date of Patent: Dec. 18, 2012

(54) METHOD FOR PRODUCING SILICON NANOSTRUCTURES

(75) Inventors: Ching-Fuh Lin, Taipei (TW); Shu-Jia Syu, Taipei (TW)

(73) Assignee: National Taiwan University, Taipei (TW)

( * ) Notice: Subject to any disclaimer, the term of this patent is extended or adjusted under 35 U.S.C. 154(b) by 271 days.

(21) Appl. No.: 12/790,331

(22) Filed: May 28, 2010

(65) Prior Publication Data

US 2011/0215441 A1    Sep. 8, 2011

(30) Foreign Application Priority Data

Mar. 2, 2010 (TW) ............................... 99105914 A

(51) Int. Cl.
H01L 21/302 (2006.01)

(52) U.S. Cl. ............... 438/745; 977/700; 257/618

(58) Field of Classification Search ............ 257/618; 977/700

See application file for complete search history.

(56) References Cited

U.S. PATENT DOCUMENTS

| | | | |
|---|---|---|---|
| 6,686,257 B1 | 2/2004 | Wu et al. | |
| 6,762,134 B2 * | 7/2004 | Bohn et al. | 438/745 |
| 6,790,785 B1 * | 9/2004 | Li et al. | 438/745 |
| 2003/0157783 A1 | 8/2003 | Fonash et al. | |
| 2009/0293946 A1 | 12/2009 | Lin et al. | |
| 2010/0248449 A1 * | 9/2010 | Hildreth et al. | 438/460 |

FOREIGN PATENT DOCUMENTS

| | | |
|---|---|---|
| TW | 200409222 | 6/2004 |
| TW | I311545 | 7/2009 |

OTHER PUBLICATIONS

Peng, K., Wu, Y., Fang, H., Zhong, X., Xu, Y. and Zhu, J. (2005), Uniform, Axial-Orientation Alignment of One-Dimensional Single-Crystal Silicon Nanostructure Arrays. Angew. Chem. Int. Ed., 44: 2737-2742.*

Effect of Catalyst Shape and Etchant Composition on Etching Direction in Metal-Assisted Chemical Etching of Silicon to Fabricate 3D Nanostructures Owen James Hildreth, Wei Lin, and Ching Ping Wong ACS Nano 2009 3 (12), 4033-4042.*

Oxidation Rate Effect on the Direction of Metal-Assisted Chemical and Electrochemical Etching of Silicon Zhipeng Huang, Tomohiro Shimizu, Stephan Senz, Zhang Zhang, Nadine Geyer, and Ulrich Gösele The Journal of Physical Chemistry C 2010 114 (24), 10683-10690 Publication Date (Web): May 27, 2010.*

Peng, K. Q., Hu, J. J., Yan, Y. J., Wu, Y., Fang, H., Xu, Y., Lee, S. T. and Zhu, J. (2006), Fabrication of Single-Crystalline Silicon Nanowires by Scratching a Silicon Surface with Catalytic Metal Particles. Adv. Funct. Mater., 16: 387-394. Article first published online: Dec. 8, 2005.*

* cited by examiner

*Primary Examiner* — Thao Le
*Assistant Examiner* — Laura Dykes
(74) *Attorney, Agent, or Firm* — Stout, Uxa, Buyan & Mullins, LLP

(57) ABSTRACT

The present invention provides silicon nanostructures and their producing method. By employing a metal-assisted chemical etching method, the bottom of the produced silicon nanostructures, connected to the silicon substrate, is porous and side etched, such that the silicon nanostructures can be easily transferred to a hetero-substrate by a physical manner.

19 Claims, 8 Drawing Sheets

Pa9469　　10kV　　5 μm　　5000X

Pa9465　　10kV　　1 μm　　20000X

Pa9956    10kV    0.5 μm    50000X

Pa0021    10kV    1 μm    30000X

METHOD FOR PRODUCING SILICON NANOSTRUCTURES

CROSS-REFERENCE TO RELATED APPLICATIONS

The entire contents of Taiwan Patent Application No. 099105914, filed on Mar. 2, 2010, from which this application claims priority, are incorporated herein by reference.

BACKGROUND OF THE INVENTION

1. Field of the Invention

The present invention relates to semiconductor nanostructures and their producing method and applications.

2. Description of Related Art

Silicon nanostructures have potential applications in optoelectronics. For example, they can function as light-absorbing layer, light-emitting layer, or anti-reflection layer of the optoelectronics. Epitaxy, Silicon On Insulator (SOI), vapor-liquid-solid growth, and chemical etching methods may be used to produce the silicon nanostructures.

In these methods, epitaxy and Silicon On Insulator methods are disadvantageous as their high manufacturing cost. Vapor-liquid-solid growth method is subject to high temperature and high vacuum conditions and the life cycle of the carriers is reduced due to metal contamination. Chemical etching method suffers from the complicated processes and high manufacturing cost, because the silicon nanostructures are produced from an epitaxial growth thin film, which is formed by costly chemical vapor deposition and laser annealing method.

In another aspect, silicon nanostructures are typically formed on silicon substrate to avoid lattice dis-match problems. In some applications such as solar cells, photo detectors, and biosensors, however, one-tenth of the thickness of the silicon substrate may be enough, and even only the nanostructures are needed. In the later case, prior art utilizes wet etching method to etch the silicon substrate for obtaining a required thickness. Most of the silicon substrate will be etched and wasted. The manufacturing cost of optoelectronics will be therefore increased.

In another aspect, technology of transferring silicon nanostructures or silicon microstructures to a hetero-substrate also has potential applications. Typically prior art utilizes epitaxy or Silicon On Insulator method to form silicon nanostructures on a silicon substrate. The silicon substrate is then selectively etched and the remained silicon nanostructures are transferred to another substrate, such as a glass substrate or a plastic substrate. As mentioned above, both the epitaxy and Silicon On Insulator method are cost-plus methods.

Accordingly, it would be advantageous to provide silicon nanostructures and their forming methods and applications for decreasing the manufacturing cost, increasing the yield, and promoting the performance of the nanostructures.

SUMMARY OF THE INVENTION

An object of the present invention is to provide silicon nanostructures and their forming methods and applications for decreasing the manufacturing cost, increasing the yield, and promoting the performance of the nanostructures and in particularly the nanostructures can be produced under room temperature.

According to the object, one embodiment of the present invention provides a method for forming a plurality of silicon nanostructures, comprising the steps of: providing a silicon substrate; forming a plurality of metal nanostructures on the silicon substrate; immersing the silicon substrate and the metal nanostructures in a first etching solution to etch silicon under the metal nanostructures; immersing the silicon substrate and the metal nanostructures in a second etching solution, resulting a side etching; and removing the metal nanostructures, forming the silicon nanostructures.

According to the object, one embodiment of the present invention provides a method for transferring silicon nanostructures, comprising: providing a silicon substrate; etching a surface of the silicon substrate to form a plurality of silicon nanostructures; deposit a metal nanostructure near the bottom of each silicon nanostructure; side etching the silicon nanostructures based on the metal nanostructure; and physically transferring the silicon nanostructures to a hetero-substrate.

According to the object, one embodiment of the present invention provides a silicon nanostructure whose root portion is side etched and has porous structures.

DETAILED DESCRIPTION OF THE PREFERRED EMBODIMENT

Reference will now be made in detail to specific embodiments of the invention. Examples of these embodiments are illustrated in accompanying drawings. While the invention will be described in conjunction with these specific embodiments, it will be understood that it is not intended to limit the invention to these embodiments. On the contrary, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In other instances, well-known components and process operations are not been described in detail in order not to unnecessarily obscure the present invention. While drawings are illustrated in details, it is appreciated that the quantity of the disclosed components may be greater or less than that disclosed, except expressly restricting the amount of the components.

Figure 1A:
FIG. 1A to FIG. 1F show a method for forming a plurality of silicon nanostructures according to one embodiment of the present invention.
Figure 1B:
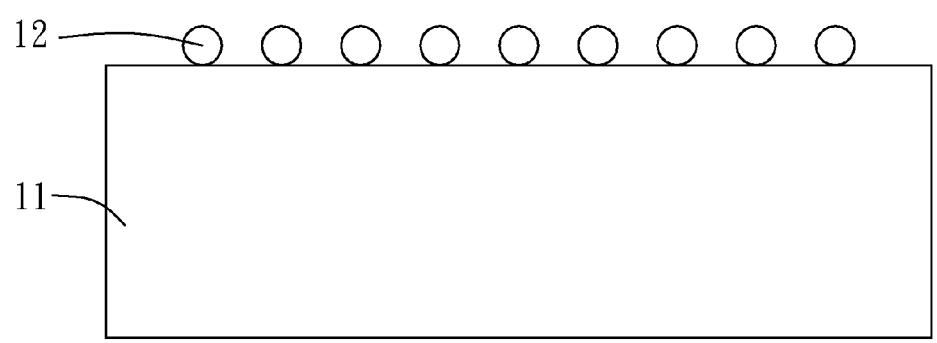
Figure 1C:
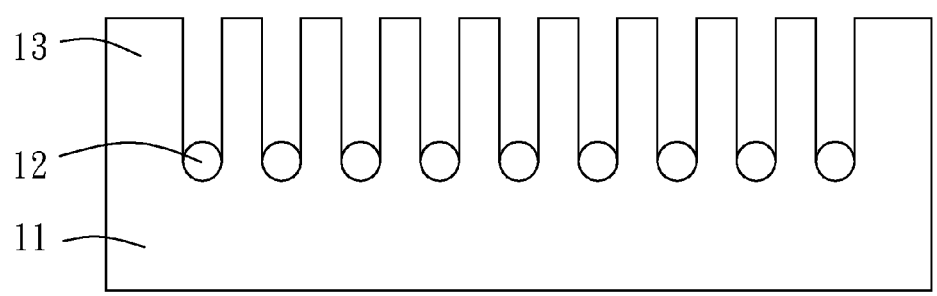
Figure 1D:
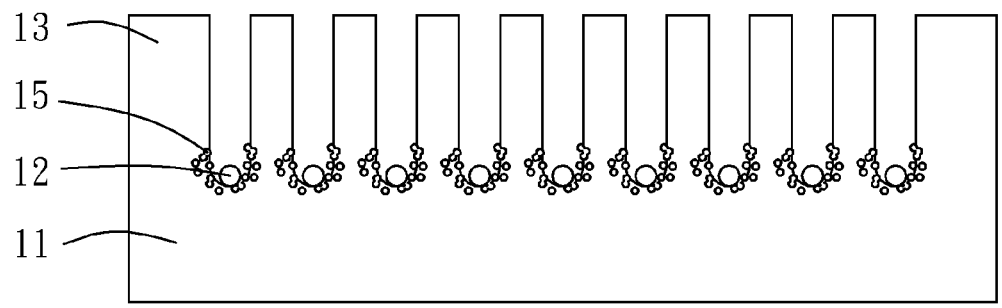
Figure 1E:
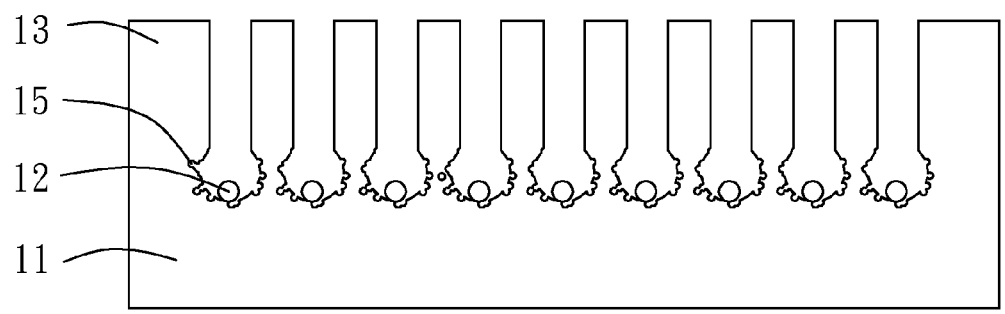
Figure 1F:
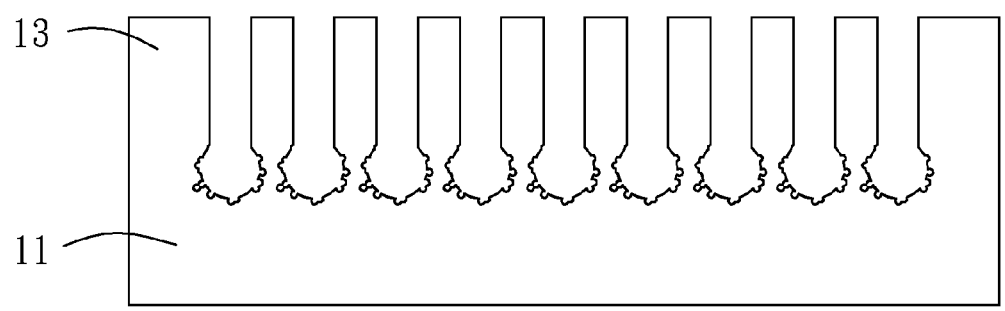

FIG. 1A to FIG. 1F show a method for forming a plurality of silicon nanostructures according to one embodiment of the present invention. Referring to FIG. 1A, a silicon substrate 11 is provided. The silicon substrate 11 may be n-type or p-type of single-crystalline, poly-crystalline, or amorphous silicon-based substrate. Referring to FIG. 1B, a plurality of metal nanostructures 12 are formed on the silicon substrate 11. Referring to FIG. 1C, the silicon substrate 11 containing metal nanostructures 12 is immersed in a first etching solution. The first etching solution will etch the silicon under the metal nanostructures 12, and a plurality of rough silicon nanostructures 13 is formed. Referring to FIG. 1D, the as-prepared silicon substrate 11 containing metal nanostructures 12 is immersed in a second etching solution, and each metal nanostructure 12 will generate small volume of metal nanoparticles 15 on the side wall near the bottom of each silicon nanostructure 13. Referring to FIG. 1E, the root portion of the rough silicon nanostructures 13 is side etched by metal nanoparticles 15. Referring to FIG. 1F, the metal nanostructures 12 and small volume of metal nanoparticles 15 are removed, and silicon nanostructures 13 and silicon substrate 11 are remained to form small volume of nanocavities at the side wall of the root portion of each silicon nanostructures 13.

According to the embodiment of the present invention, the metal nanostructures 12 may comprise gold (Au), silver (Ag), copper (Cu), platinum (Pt), or iron (Fe) nanostructures, and the morphology of the metal nanostructures 12 may comprise regular or irregular metal nanostructures, for example, regular or irregular of nanoparticles, nanoholes, nanoislands, nanomeshes, or combination thereof.

Method for forming the metal nanostructures 12 may comprise Electrodeposition, Electron Beam Evaporation, thermal evaporation, and the likes. For example, Optical Lithography, Electron Beam Lithography, or Nanosphere lithography may define a patterned mask, and then the metal nanostructures may be deposited by the Electrodeposition, Electron Beam Evaporation, and thermal evaporation methods through the mask.

Alternatively, the metal nanostructures 12 may be formed by a metal-assisted chemical etching method. For example, an oxide layer, such as silicon oxide, silicon dioxide, silicon nitride, or silicon oxynitride, is firstly formed on the silicon substrate. Then the silicon substrate containing the oxide layer is immersed in a fluoride solution, which comprises metal ions, such as gold (Au), silver (Ag), copper (Cu), platinum (Pt), or iron (Fe) ions. The oxide layer will be etched and removed by the fluoride solution, and metal ions will be reduced and form metal nanostructures on the surface of the silicon substrate. In some embodiments of the present invention, the metal nanostructures are formed by the metal-assisted chemical etching method described in U.S. patent application, application Ser. No. 12/713,094, titled "Silicon substrate having nanostructures and method for producing the same and application thereof," the entire content of which is incorporated herein by reference.

According to the embodiment of the present invention, both the first etching solution and the second etching solution comprise hydrogen peroxide ($H_2O_2$) and fluoride, for example, comprising hydrogen peroxide and hydrogen fluoride (HF). In addition, by controlling the ratio of hydrogen peroxide to fluoride, the etching direction can be controlled. If the percentage of fluoride is increased, the etching direction will be more anisotropic. If the percentage of hydrogen peroxide is increased, the etching direction will be more isotropic. In particular, in the first etching solution, the molar ratio of hydrogen peroxide to hydrogen fluoride ($[H_2O_2]:[HF]$) is less than 1:35; in the second etching solution, the molar ratio of hydrogen peroxide to hydrogen fluoride ($[H_2O_2]:[HF]$) is more than 1:35. Accordingly, immersing the silicon substrate in the first etching solution will result in anisotropic etching, as shown in FIG. 1C; immersing the silicon substrate in the second etching solution will result in isotropic etching, as shown in FIG. 1D.

The mechanism of the etching direction control is described as follows. The metal nanostructures are oxidized by hydrogen peroxide and thus metal ions are released. The metal nanostructures are negatively charged and metal ions are positively charged. Because positively charged metal ions are attracted by the metal nanostructures, metal ions are distributed in the vicinity of metal nanostructures, not far away from the metal nanostructures, so that the metal ions are possible to be reduced and backed to the metal nanostructures. When the percentage of hydrogen peroxide is increased, i.e., when the concentration of hydrogen peroxide is increased, the number of metal ions is increased. Metal ions will react with the side wall of the silicon nanostructures and small volume of metal nanoparticles will be generated at the side wall of the silicon nanostructures. These small metal nanoparticles will etch the side wall of the silicon nanostructures in a side direction, resulting in many porous structures. According to one embodiment of the present invention, side etchings occur in 1 nm to 10 μm around each metal nanoparticle at side wall of the silicon nanostructures.

Figure 2A:
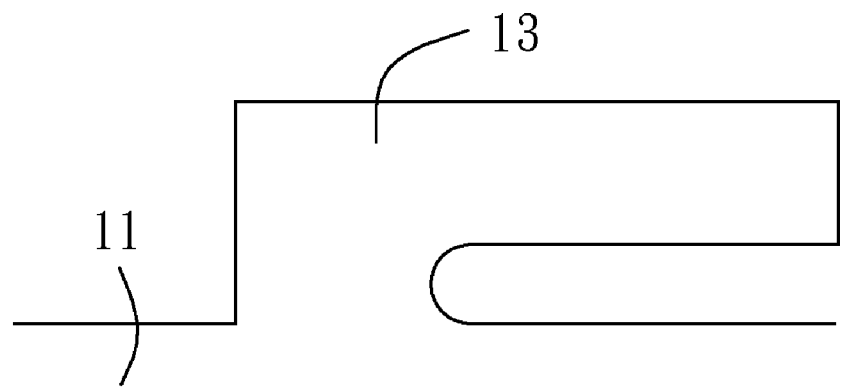
FIG. 2A and FIG. 2B illustrate two cantilever-shaped of silicon nanostructures produced by two embodiments of the present invention.
Figure 2B:
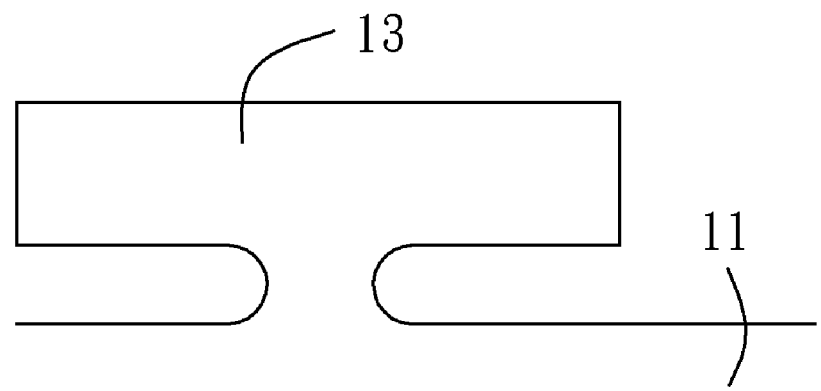

The method provided by the embodiment of the present invention not only can produce silicon nanostructures of FIG. 1E in which the silicon nanostructure has a root portion that is side etched and has porous structures and the silicon nanostructures may comprise silicon nanowires, nanosheets, nanoribbons, and nanoholes, but also can produce other silicon nanostructures, such as silicon diaphragms, silicon cantilever beams, and other three dimensional (3D) architectures, by controlling the process parameters, such as different etching solutions and concentrations, different etching times, and/or controlling the depth of the side etching. FIG. 2A and FIG. 2B illustrate two cantilever-shaped of silicon nanostructures 13 produced by two embodiments of the present invention. Nanostructures produced by the present invention not only can be employed in optoelectronics, but also can be employed to produce other MicroElectroMechnical (MEM) devices, such as pressure sensors, accelerometers, microphone, micro valve, micro pump, micro tip, and the likes.

Figure 3:
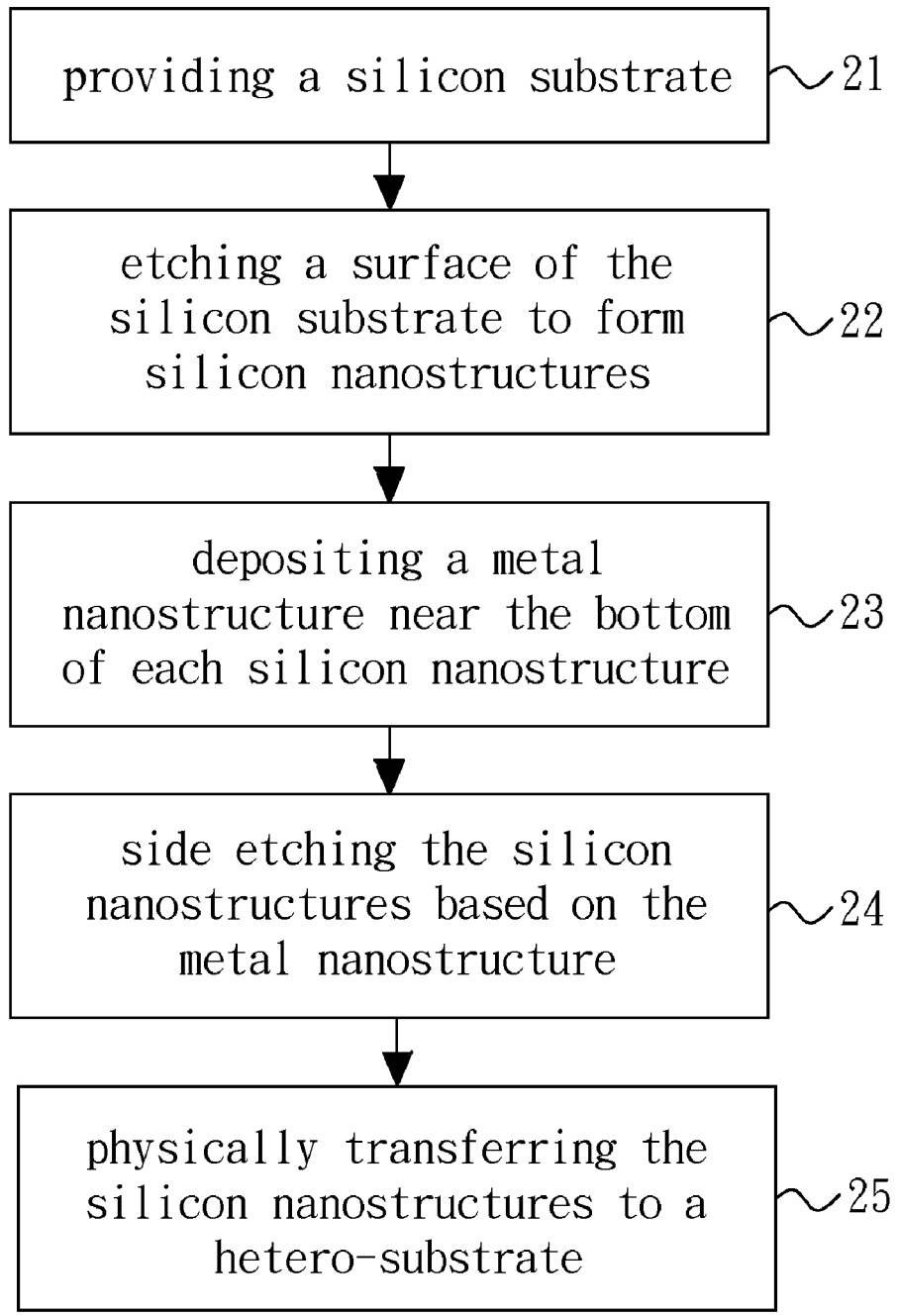
FIG. 3 shows a method for transferring silicon nanostructures according to another embodiment of the present invention.

The silicon nanostructures provided by the present invention feature in that the root portion of the nanostructure is fragile compared to other portions. By using this feature, another embodiment of the present invention provides a method for transferring silicon nanostructures, as shown in FIG. 3. The method comprises the steps as follows. Step 21, a silicon substrate is provided. Step 22, a surface of the silicon substrate is etched to form silicon nanostructures. Method for forming the silicon nanostructures should not be limited. In this exemplary example, the above-mentioned metal-assisted chemical etching method is employed to form the silicon nanostructures. Step 23, a metal nanostructure is deposited near the bottom of each silicon nanostructure. Note that if the metal-assisted chemical etching method is employed in step 22, this step will be accomplished spontaneously. Step 24, the silicon nanostructures is side etched based on the metal nanostructure. For example, the as-prepared silicon nanostructures are immersed in a solution comprising fluoride (such as hydrogen fluoride) and hydrogen peroxide, such that the metal nanostructures generate metal nanoparticles on the side wall of the silicon nanostructures, and thereby the silicon nanostructures will be etched in a side direction. Step 25, the silicon nanostructures are physically transferred to a hetero-substrate. Because the root portion of the silicon nanostructure is fragile, the silicon nanostructures can be easily removed from the silicon substrate by force. For example, the silicon nanostructures may be fixed to a hetero-substrate, and then remove the silicon substrate so that the silicon nanostructures are transferred. The hetero-substrate may comprise plastic substrate, glass substrate, quartz substrate, stainless steel substrate, metal foil, or semiconductor substrate. The silicon nanostructures and the hetero-substrate may be fixed by organic polymer adhesive, metal fusion, junction with silicon oxides under high temperature, or junction with semiconductor substrate under high temperature. Method for fixing the silicon nanostructures may further comprise to use a soft adhesive substrate, such as polymer adhesive tape, copper conductive tape, carbon conductive tape, and the likes, as the hetero-substrate or as an inter-layer of the silicon nanostructures and the hetero-substrate. Note that the sequence of step 24 and step 25 can be interchanged.

Example of Producing Silicon Nanostructure

This example uses the above-mentioned metal-assisted chemical etching method to produce silicon nanostructures. Firstly, a silicon wafer is provided and cleaned by acetone for 10 min and then cleaned by methanol. After that, preparing solution A, B, and C. Solution A is a solution of hydrofluoric acid (HF) and silver nitrate ($AgNO_3$). Solution B is a solution of hydrogen peroxide ($H_2O_2$) and hydrofluoric acid (HF), and the concentration of hydrogen peroxide is much less than that of hydrofluoric acid. Solution C is a solution of hydrogen peroxide ($H_2O_2$) and hydrofluoric acid (HF), and the concentration of hydrogen peroxide is approximate to that of hydrofluoric acid. Then, the cleaned silicon wafer is immersed in solution A for several seconds, resulting in silver nanostructures formed on the surface of the silicon wafer. Thereupon, the silicon wafer is immersed in solution B. Solution B will etch silicon under silver nanostructures, resulting in silicon nanowires being generated and silver nanostructures being deposited near the bottom of the nanowires. If the etching time is increased, the etched depth of the silicon wafer is increased to form silicon nanowires (i.e. the thickness of the nanowire is increased). After that, the silicon wafer may be immersed in solution C for several seconds so that silicon nanowires whose root portion are side etched and have porous structures are produced.

Figure 4A:
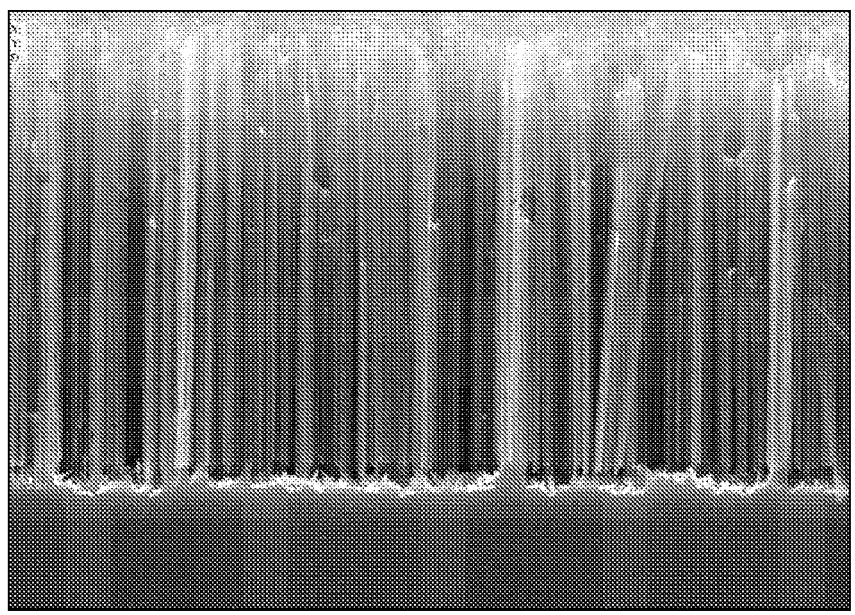
FIG. 4A and FIG. 4B show scanning electron microscope (SEM) images of silicon nanostructures produced by the embodiment of the present invention.
Figure 4B:
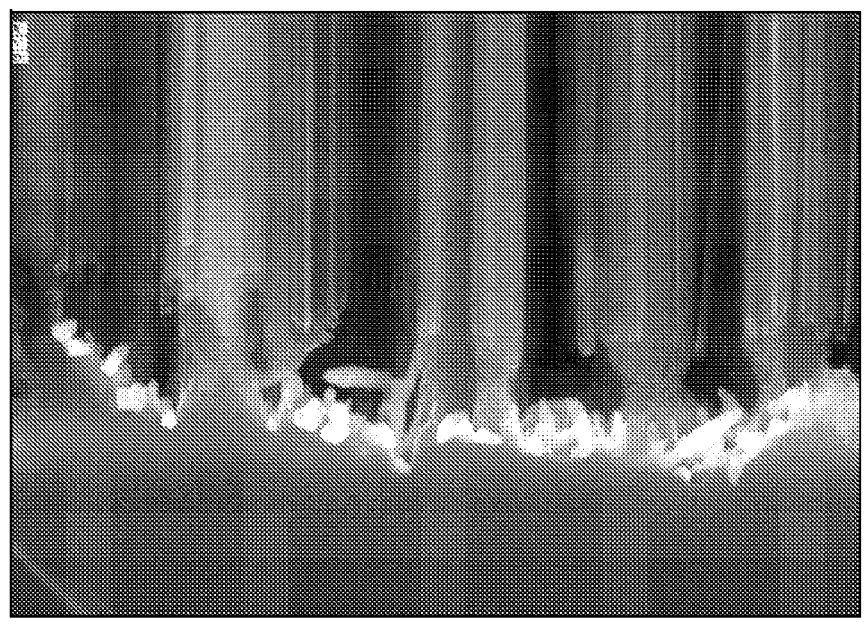

FIG. 4A and FIG. 4B show scanning electron microscope (SEM) images of silicon nanostructures produced by the embodiment of the present invention, where the magnification of FIG. 4A is 5000 and FIG. 4B 20000. FIG. 4A shows that the thickness of the silicon nanostructure is about 13 μm. FIG. 4B shows that the root portion of each silicon nanostructure has many porous structures, and many un-removed silver nanostructures are remained.

Example of Transferring Silicon Nanostructures

Figure 5A:
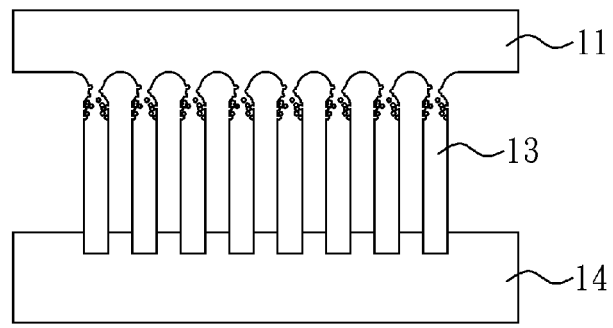
FIG. 5A and FIG. 5B show a method to transfer silicon nanostructures according to one embodiment of the present invention.
Figure 5B:
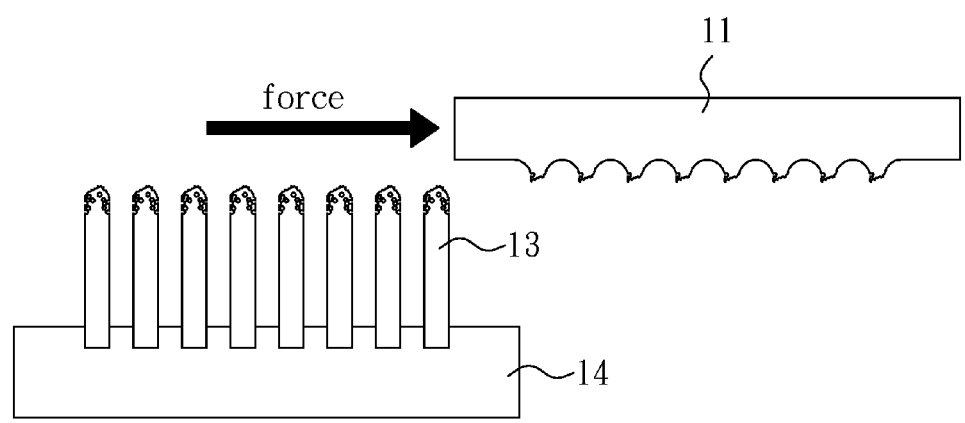

FIG. 5A and FIG. 5B show a method to physically transfer silicon nanostructures according to one embodiment of the present invention. As shown in FIG. 5A, a glass substrate is employed as a hetero-substrate 14. The top portion of the silicon nanostructure 13 is fixed to the glass substrate 14 by a polyimide tape. As shown in FIG. 5B, then, force is exerted in side of the silicon substrate 11. Because the root portion of silicon nanostructure 13 is fragile, silicon nanostructure 13 can be easily separated from the silicon substrate 11.

Figure 6A:
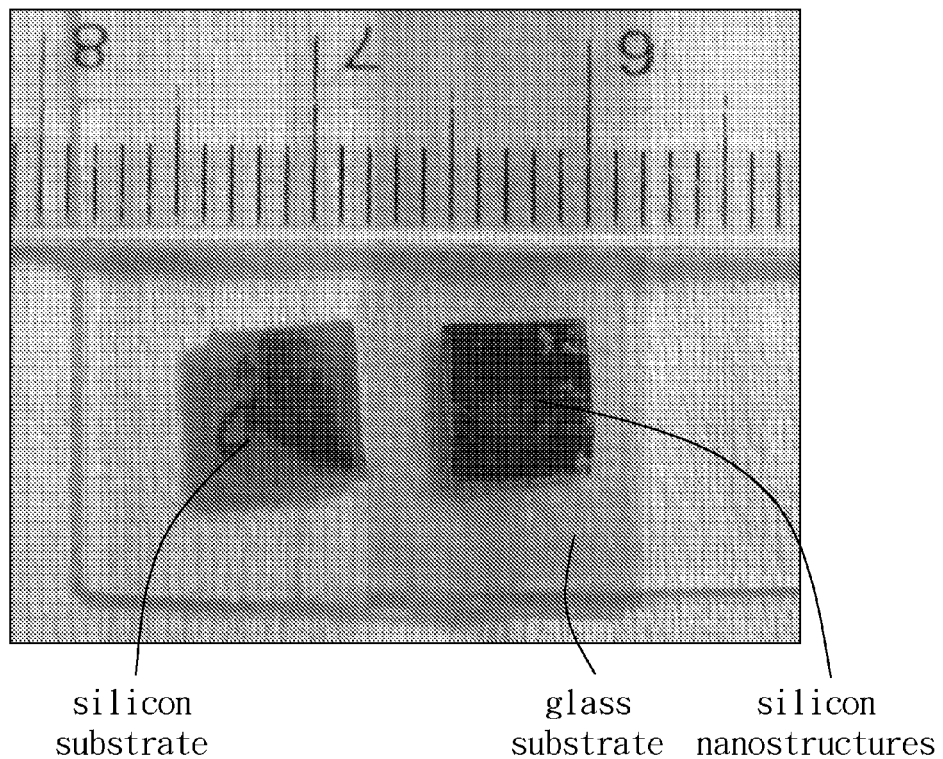
FIG. 6A shows an image of silicon nanostructures transferred to a glass substrate.
Figure 6B:
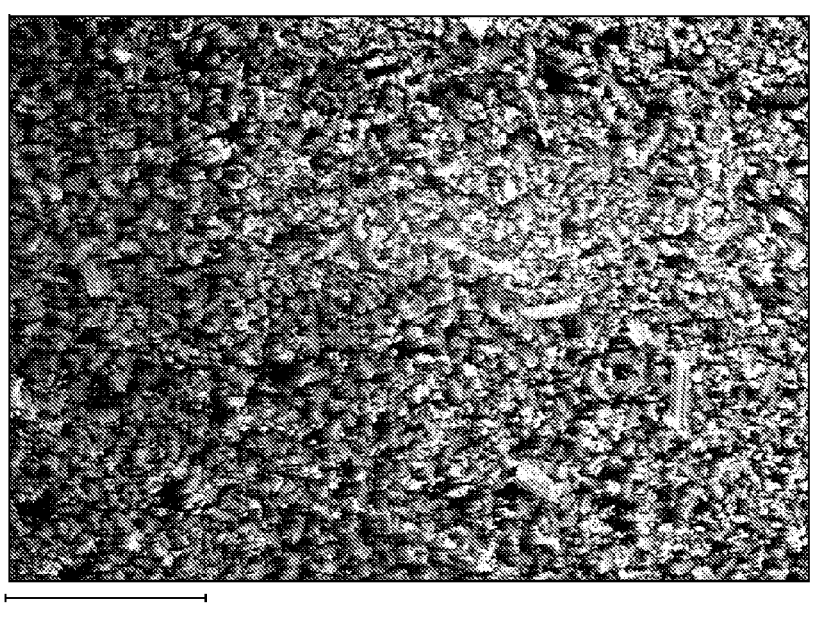
FIG. 6B shows a SEM image of transferred silicon nanostructures.
Figure 7A:
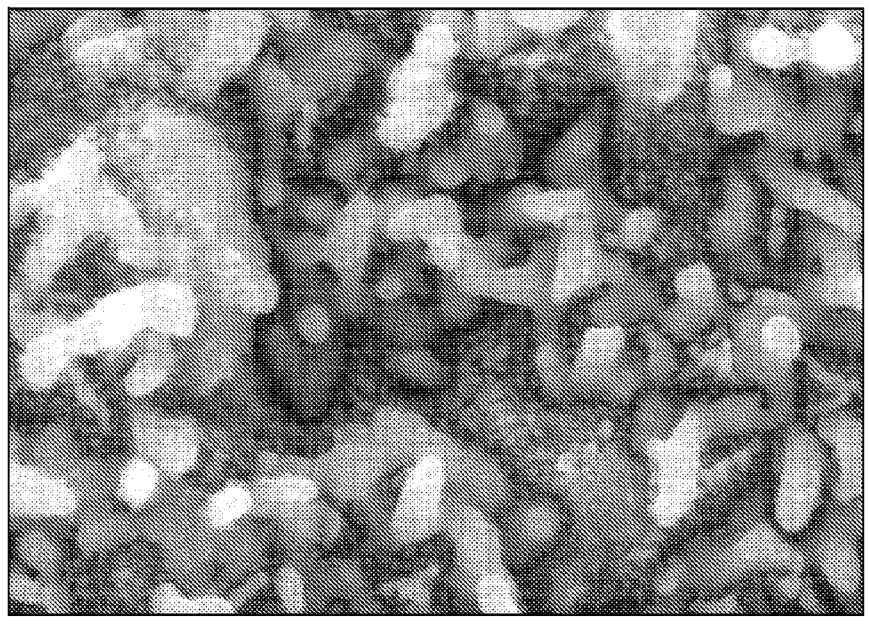
FIG. 7A shows a SEM image of silicon substrate with the silver nanostructures and silver nanoparticles after the silicon nanostructures are transferred.
Figure 7B:
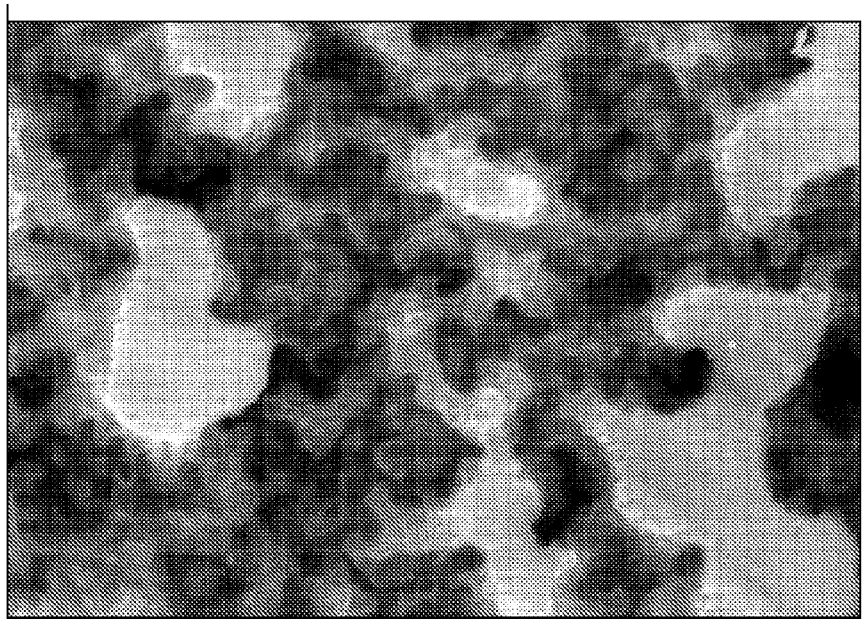
FIG. 7B shows a SEM image of silicon substrate after the silicon nanostructures are separated and after the silicon substrate is immersed in a nitride acid to remove the silver nanostructures and silver nanoparticles.

FIG. 6A shows an image of transferred silicon nanostructures in a glass substrate. FIG. 6B shows a SEM image of transferred silicon nanostructures. FIG. 7A shows a SEM image of silicon substrate after the silicon nanostructures are transferred. Many un-removed silver nanostructures and silver nanoparticles are remained in the substrate. The silver nanoparticles are generated due to the second etching solution. The side wall of silicon nanostructures are side etched by the silver nanoparticles, resulting in porous structures. FIG. 7B shows a SEM image of silicon substrate after the silicon nanostructures are separated and after the silicon substrate is immersed in a nitride acid to remove the silver nanostructures and silver nanoparticles. The porous structures can be observed in this image.

Although the silicon substrate is used to produce silicon nanostructures in the above embodiments, other semiconductor, such as, but not limited to, germanium, III-V compound semiconductor, and II-VI compound semiconductor, can be used to produce other semiconductor nanostructures according to other embodiments of the present invention.

Although specific embodiments have been illustrated and described, it will be appreciated by those skilled in the art that various modifications may be made without departing from the scope of the present invention, which is intended to be limited solely by the appended claims.

What is claimed is:

1. A method for forming silicon nanostructures, comprising the steps of:
   providing a silicon substrate;
   forming a plurality of metal nanostructures on the silicon substrate;
   immersing the silicon substrate and the metal nanostructures in a first etching solution to anisotropically etch silicon under the metal nanostructures, thereby forming a plurality of silicon nanostructures and a plurality of dug structures with each dug structure comprising at least one of the metal nanostructures at its bottom;
   immersing the silicon substrate in a second etching solution, resulting in a side etching by using the metal nanostructures as the etching center to isotropically etch a root portion of each silicon nanostructure and thus form porous structures at the root portion; and
   removing the metal nanostructures.

2. The method as recited in claim 1, wherein the metal nanostructures comprise regular or irregular patterned metal nanostructures.

3. The method as recited in claim 2, wherein the metal nanostructures comprise gold (Au), silver (Ag), copper (Cu), platinum (Pt), or iron (Fe) nanostructures.

4. The method as recited in claim 2, wherein the morphology of the metal nanostructures comprises nanoparticles, nanoholes, nanoislands, nanomeshes, or combination thereof.

5. The method as recited in claim 2, wherein the metal nanostructures are formed by the steps of:
   forming an oxide layer on the silicon substrate; and
   immersing the silicon substrate containing the oxide layer in a fluoride solution comprising metal ions, whereby the oxide layer is etched and removed by the fluoride solution, and the metal ions are reduced and thus form metal nanostructures on the silicon substrate.

6. The method as recited in claim 2, wherein the metal nanostructures are formed by electrodeposition, electron beam evaporation, or thermal evaporation method.

7. The method as recited in claim 2, wherein a patterned mask is firstly defined by optical lithography, electron beam lithography, or nanosphere lithography, and then the metal nanostructures are deposited through the mask.

8. The method as recited in claim 7, wherein the metal nanostructures are deposited by electrodeposition, electron beam evaporation, or thermal evaporation method.

9. The method as recited in claim 1, wherein both the first etching solution and the second etching solution comprise hydrofluoric acid (HF) and hydrogen peroxide ($H_2O_2$).

10. The method as recited in claim 9, wherein the ratio of hydrogen peroxide to hydrofluoric acid is determined to control the etching direction.

11. The method as recited in claim 10, if the percentage of hydrofluoric acid is increased, the etching direction will be more anisotropic.

12. The method as recited in claim 10, if the percentage of hydrogen peroxide is increased, the etching direction will be more isotropic.

13. The method as recited in claim 12, the percentage of hydrogen peroxide is increased, such that the metal nanostructures at the bottom of the dug structures generate a small volume of metal nanoparticles on the side wall near the root portion of the silicon nanostructures, resulting in the side etching and the porous structures.

14. The method as recited in claim 13, wherein the side etching occurs in 1 nm to 10 μm around each metal nanoparticle at side wall of the silicon nanostructures.

15. The method as recited in claim 1, further comprising:
physically transferring the silicon nanostructures to a hetero-substrate.

16. The method as recited in claim 15, wherein the hetero-substrate comprises a plastic substrate, a glass substrate, a quartz substrate, a stainless steel substrate, a metal foil, or a semiconductor substrate.

17. The method as recited in claim 15, wherein the physical transfer comprises fixing the silicon nanostructures to the hetero-substrate, and disconnecting the root portions of the silicon nanostructures from the silicon substrate.

18. The method as recited in claim 17, wherein the silicon nanostructures and the hetero-substrate are fixed by employing an organic polymer adhesive, a metal fusion, a silicon oxides bonding under high temperature, or a direct high temperature bonding if the hetero-substrate is a semiconductor substrate.

19. The method as recited in claim 17, wherein the silicon nanostructures and the hetero-substrate are fixed by using a soft adhesive substrate, which comprises a polymer adhesive tape, a copper conductive tape, or a carbon conductive tape, as the hetero-substrate or as an inter-layer between the silicon nanostructures and the hetero-substrate.

* * * * *